United States Patent
Mochizuki (10) Patent No.: US 7,504,293 B2
(45) Date of Patent: Mar. 17, 2009

(54) FABRICATION METHOD FOR SEMICONDUCTOR DEVICE

(75) Inventor: Marie Mochizuki, Yokohama (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 20 days.

(21) Appl. No.: 11/635,690

(22) Filed: Dec. 8, 2006

(65) Prior Publication Data
US 2007/0134863 A1   Jun. 14, 2007

(30) Foreign Application Priority Data
Dec. 13, 2005   (JP) ............................. 2005-359068

(51) Int. Cl.
    *H01L 21/336* (2006.01)
(52) U.S. Cl. ............. 438/197; 438/277; 438/302; 438/305; 257/E21.059; 257/E21.345; 257/E21.437; 257/E21.623; 257/E29.266
(58) Field of Classification Search ........... 438/197, 438/277, 302, 305; 257/E21.059, E21.345, 257/E21.437, E21.623, E29.266
See application file for complete search history.

(56) References Cited

U.S. PATENT DOCUMENTS

| | | | | |
|---|---|---|---|---|
| 5,733,792 A * | 3/1998 | Masuoka | ...................... | 438/302 |
| 5,783,457 A * | 7/1998 | Hsu | ............................. | 438/302 |
| 5,936,278 A * | 8/1999 | Hu et al. | ...................... | 257/336 |
| 6,190,980 B1 * | 2/2001 | Yu et al. | ...................... | 438/302 |
| 6,255,174 B1 * | 7/2001 | Yu | ............................. | 438/286 |
| 6,282,123 B1 * | 8/2001 | Mehta | .................... | 365/185.28 |
| 6,475,863 B1 * | 11/2002 | Kim | ............................. | 438/264 |
| 6,544,851 B2 * | 4/2003 | Ponomarev et al. | ......... | 438/289 |
| 6,596,594 B1 * | 7/2003 | Guo | ............................. | 438/279 |
| 6,617,229 B2 * | 9/2003 | Kim | ............................. | 438/585 |
| 7,052,965 B2 * | 5/2006 | Park et al. | .................... | 438/302 |
| 2002/0142556 A1 * | 10/2002 | Kim | ............................. | 438/305 |
| 2003/0030103 A1 * | 2/2003 | Ryu et al. | .................... | 257/331 |

FOREIGN PATENT DOCUMENTS

JP   2003-046086   2/2003

OTHER PUBLICATIONS

Takashi Hori et al.; Deep-Submicrometer Large-Angle-Tilt Implanted Drain (LATID) Technology; IEEE Transactions on Electron Devices, vol. 39, No. 10, Oct. 1992.

* cited by examiner

*Primary Examiner*—Andy Huynh
(74) *Attorney, Agent, or Firm*—Volentine & Whitt, P.L.L.C.

(57) ABSTRACT

A fabrication method for a semiconductor device includes a step of forming a gate insulating film on a semiconductor layer, and a step of forming a first gate electrode layer on the gate insulating film. The fabrication method also includes a step of forming a pocket ion region under the first gate electrode layer, and a step of forming a second gate electrode layer overlaying the first gate electrode layer after forming the pocket ion region.

18 Claims, 7 Drawing Sheets

FABRICATION METHOD FOR SEMICONDUCTOR DEVICE

BACKGROUND OF THE INVENTION

1. Field of the Invention

The present invention relates to a method of fabricating a semiconductor device, and more particularly to a method of fabricating a semiconductor device having a pocket ion region designed to suppress the short channel effect.

2. Description of the Related Art

Recently in the field of semiconductor devices, an SOI (silicon on insulator) structure, where a silicon (Si) layer is formed on an insulating layer, is being commercialized. Substrates having an SOI structure are, for example, an SOS (Silicon On Sapphire) substrate formed by growing a silicon thin film on a sapphire substrate by vapor phase epitaxial growth, an SIMOX (Separation by Ion implanted Oxygen) substrate formed by forming a silicon dioxide ($SiO_2$) layer inside the silicon substrate by implanting oxygen ions into the silicon substrate and then performing heat treatment, or a substrate formed by bonding silicon substrates via an oxide film (wafer bonding). A semiconductor device having an SOI structure has various good characteristics compared with a conventional semiconductor device using bulk silicon. If an SOI structure is applied to a MOSFET, the insulating layer having the SOI structure is placed immediately below the element active area of the MOSFET. Thus, the parasitic capacitance to be added to the MOSFET can be dramatically decreased. Accordingly, the switching characteristic of the MOSFET can be improved, operation speed can be increased, power can be saved and reliability can be improved.

Lately as semiconductor devices are further miniaturized and the degree of integration further increases, the short channel effect has started to be taken seriously in the field of MOSFET. Short channel effect is a phenomena that the threshold voltage of a MOSFET drops when the channel length of the MOSFET (distance between the source and drain of the MOSFET) is short due to the miniaturization of the MOSFET. The major cause of the short channel effect is DIBL (Drain Induced Barrier Lowering), which decreases the barrier of the channel region against carriers when voltage is applied to the drain. The dropping of the threshold voltage increases as the channel length decreases. This is because the formation of the depletion layer into the channel region is promoted by an electric field that extends radially from the drain. In other words, the threshold voltage is apparently lower in an area near the source and drain than in the center portion of the channel region because of the electric field that exists radially. The influence of the area having an apparently lower threshold voltage on the threshold of an entire MOSFET is not major if the channel length is long. However, if the channel length is short because of miniaturization of the MOSFET, the ratio of the area, where the threshold voltage is apparently low to the entire channel area, becomes high. Therefore, the influence of this area on the threshold of an entire MOSFET increases accordingly.

One way of suppressing the short channel effect is forming a so called "pocket ion region" in the semiconductor layer, as disclosed in Japanese Patent Application Kokai (Laid-Open) No. 2003-46086, and T. Hori et al, "Deep Sub-micrometer Large-Angle-Tilt Implanted Drain (LATID) Technology," IEEE Trans. Electron Dev., 39 (10), 2312 (1992). A pocket ion region is a region of which conductive type is the same as a channel region, and where impurities are diffused so as to contact the source-drain region near the gate electrode. The concentration of impurities is higher in the pocket ion region than in the channel region. By forming a pocket ion region, the growth of the depletion layer from the source-drain region can be suppressed, and the short channel effect can be suppressed.

The effect of suppressing the short channel effect is greater as the impurities concentration in the pocket ion region becomes higher. Therefore as MOSFET miniaturization progresses and short channel effect increases, pocket concentration tends to increase. Also the effect of suppressing the short channel effect is greater as the pocket position becomes deeper under the gate (i.e., becomes closer to the center of the lower face of the gate). Therefore, the pocket region tends to be formed by tilted ion implantation with a larger angle.

If the dosage (impurities concentration) in the pocket region increases, the impurities concentration in the channel region increases. Then the maximum depletion layer width decreases, and forming a complete depletion type transistor becomes difficult. A possible solution for avoiding such difficulty is forming a shallow (thin) pocket region from the Si layer surface to promote depletion of the area under the SOI layer. However, to achieve a sufficient depletion promotion, the impurities concentration peak depth of the ion implantation when a pocket is formed must be set to about 10 nm, which radically deteriorates the short channel effect suppression. Therefore, in order to form a pocket to be shallow (thin) from the Si surface layer without diminishing the short channel effect suppression, the pocket must be formed by tilted ion implantation with a large angle. Specifically, the depth of the pocket under the gate must be about the same as the overlap length of the LDD (Light Doped Drain) region, which is about 20 nm. Therefore about a 65° implantation angle is required. However, the angle of tilted ion implantation is restricted to be in a range where the shielding by the adjacent gate has no effect on the transistor characteristics, and therefore is limited to about 30° to 40°.

SUMMARY OF THE INVENTION

It is an object of the present invention to provide a semiconductor device fabrication method which allows ion implantation into an area under the gate electrode at a larger angle (with respect to the vertical line).

It is another object of the present invention to provide a semiconductor device fabrication method which can promote depletion in an area under the semiconductor layer without diminishing the effect of the short channel effect suppression.

According to one aspect of the present invention, there is provided an improved fabrication method for a semiconductor device. The fabrication method includes a step of forming a gate insulating film on a semiconductor layer, and a step of forming a first gate electrode layer on the gate insulating film. The fabrication method also includes a step of forming a pocket ion region under the first gate electrode layer; and a step of forming a second gate electrode layer overlaying the first gate electrode layer after forming the pocket ion region.

Since the height (thickness) of an adjacent gate electrode is set to be low, the ion implantation angle can be set to be large with respect to the vertical line. In other words, the pocket region can be formed without being affected by the present of the gate electrode of the adjacent transistor even if a desired ion implantation angle is about 60°, because the height of the first gate electrode layer is low when the pocket region is formed.

Since the second gate electrode layer is formed on top of the first gate electrode layer after the pocket region is formed, the height of the gate electrode, sufficient for decreasing the resistance of the gate electrode, can be obtained in the end.

These and other objects, aspects and advantages of the present invention will become apparent to those skilled in the art when the following detailed description and appended claims is read and understood in conjunction with the accompanying drawings.

DETAILED DESCRIPTION OF THE INVENTION

Embodiments of the present invention will now be described in detail with reference to the accompanying drawings.

First Embodiment

Figure 1A:
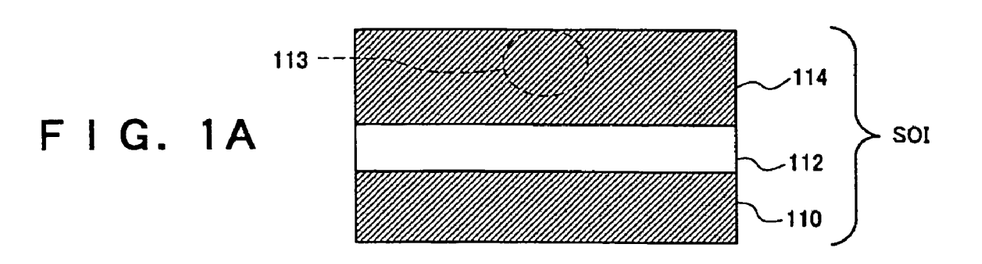
FIG. 1A to FIG. 1C are cross-sectional views depicting steps of the semiconductor device fabrication method according to a first embodiment of the present invention.

FIG. 1A to FIG. 6B are a series of diagrams depicting the fabrication method for a semiconductor device according to the first embodiment of the present invention. In the first embodiment, an SOI substrate is prepared in advance by a known method. As FIG. 1A shows, the SOI substrate has a structure where a buried oxide film 112 and an SOI layer 114 are formed on an Si substrate 110. The SOI substrate used for a semiconductor device is, for example, an SOS substrate, an SIMOX substrate or a wafer-bonded substrate. The SOS substrate is formed by growing a silicon thin film on a sapphire substrate by vapor phase epitaxial growth. The SIMOX substrate is formed by creating a silicon dioxide ($SiO_2$) layer in a silicon substrate. Specifically, the SIMOX substrate is formed by implanting oxygen ions into the silicon substrate, and then performing heat treatment. The wafer-bonded substrate is formed by bonding silicon substrates via an oxide film. The SOI layer 114 is, for example, a p-type semiconductor layer which contains p-type impurities, and the film thickness thereof is about 100 nm or less.

Although this is not illustrated, a device isolation region is formed in the SOI layer 114. The device isolation region is formed by a trench device isolation method, for example. Specifically, the device isolation region is created by forming a trench in the silicon layer 114 by RIE (Reactive Ion Etching), filling the trench with an insulating film, such as an oxide film, formed by a CVD (Chemical Vapor Deposition) method, and removing and flattening the insulating film in the device region by CMP (Chemical Mechanical Polishing) or etch back.

Then a channel region 113 is formed on the SOI substrate 114. After this, n-type impurities such as boron, BF2 or indium can be ion-implanted into the channel region 113 as channel impurities for controlling the threshold voltage if this is an N-type MOSFET. If this is a P-type MOSFET, on the other hand, p-type impurities such as arsenic or phosphorus can be ion-implanted into the channel region 113.

Figure 1B:
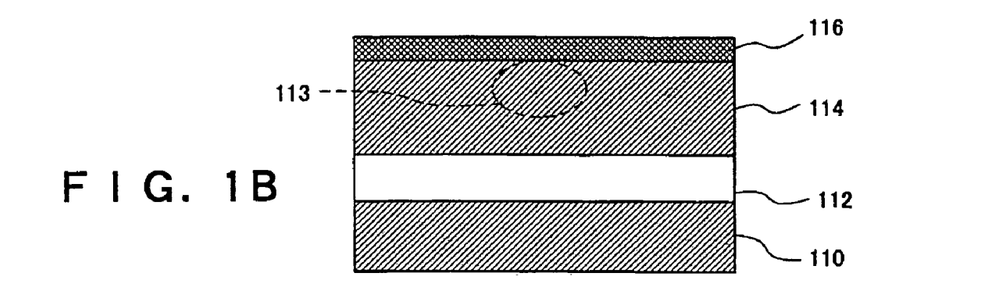
Figure 1C:
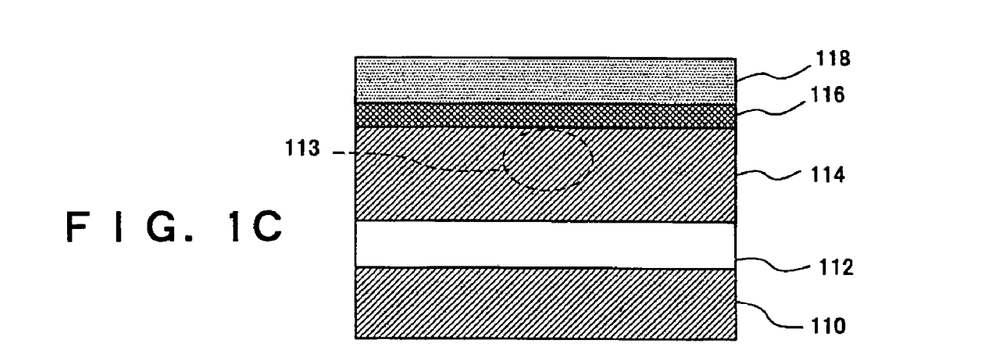

Then as FIG. 1B shows, a gate insulating film 116 is formed on the SOI layer 114. After this, polysilicon 118, for example, is deposited on the gate insulating film 116 as a first gate electrode layer, as shown in FIG. 1C. The film thickness of the polysilicon layer 118 is set to be (distance between gates of adjacent transistors + margin due to process dispersion)/tan (implantation angle), considering the desired ion implantation angle and distance between the gates of adjacent transistors. If the gate height is 1500 Å, the ion implantation angle to form the pocket region is limited to 30° or less, and if the angle of tilted ion implantation should be 60°, then the film thickness of the polysilicon layer 118 is set to about 500 Å. For the gate impurities, phosphorus or arsenic in the case of an N-type MOSFET, or boron or BF2 in the case of a P-type MOSFET, can be ion-implanted for about $2 \times 10^{15}$ $cm^{-2}$, for example.

Figure 2A:
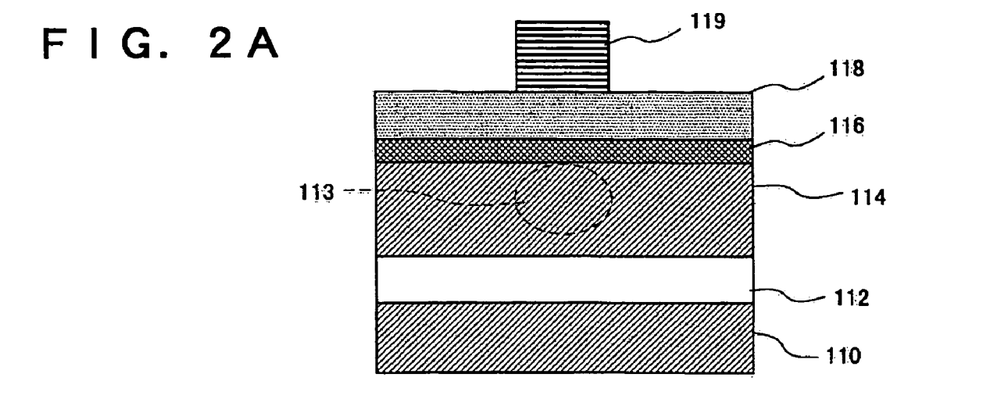
FIG. 2A and FIG. 2B are cross-sectional views depicting steps of the semiconductor device fabrication method according to the first embodiment after FIG. 1C.
Figure 2B:
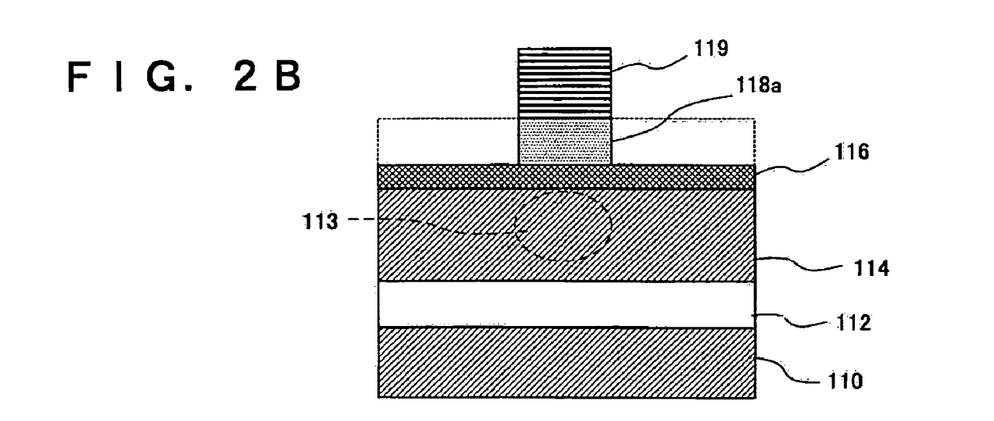
Figure 3A:
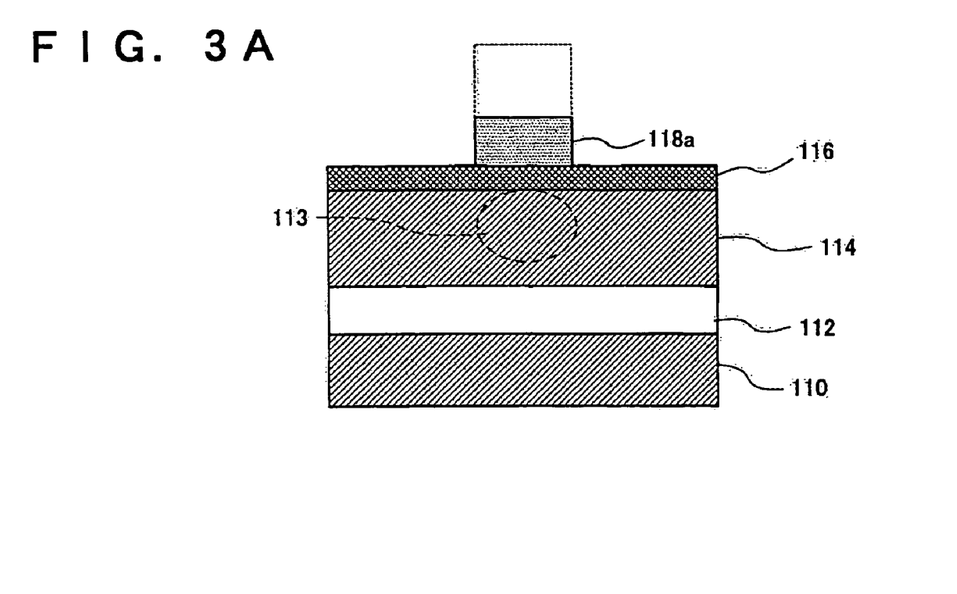
FIG. 3A and FIG. 3B are cross-sectional views depicting steps of the semiconductor device fabrication method according to the first embodiment after FIG. 2B.
Figure 3B:
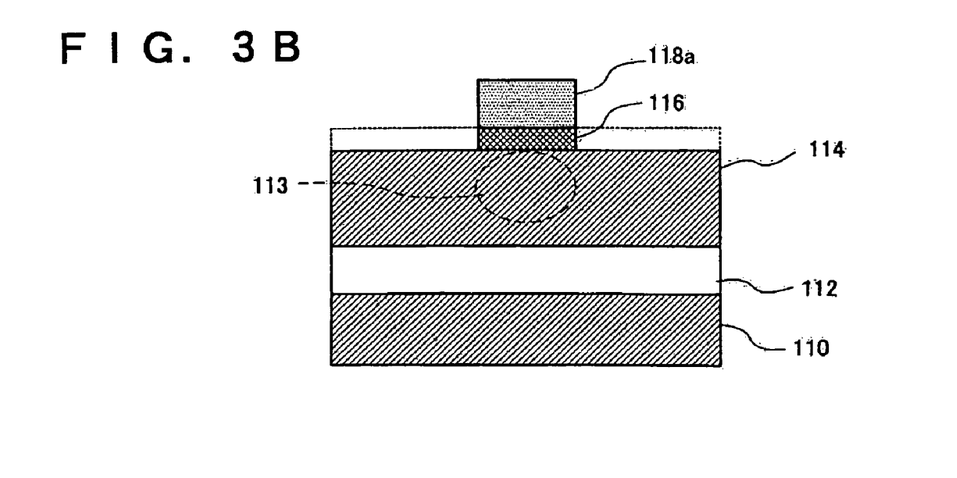

Then resist is coated on the top face of the polysilicon layer 118, and a resist pattern 119 is formed by processing the coated resist into a form of the gate electrode by photolithography, for example, as shown in FIG. 2A. Then the first gate electrode layer (lower electrode layer) 118a is patterned by selectively removing the gate oxide film 116 and the polysilicon layer 118, as FIG. 2B to FIG. 3B show, using the resist pattern 119 as an etching mask, by such a known method as RIE. The resist pattern 119 is removed by such a known method as ashing after patterning the first gate electrode layer 118a.

Figure 4A:
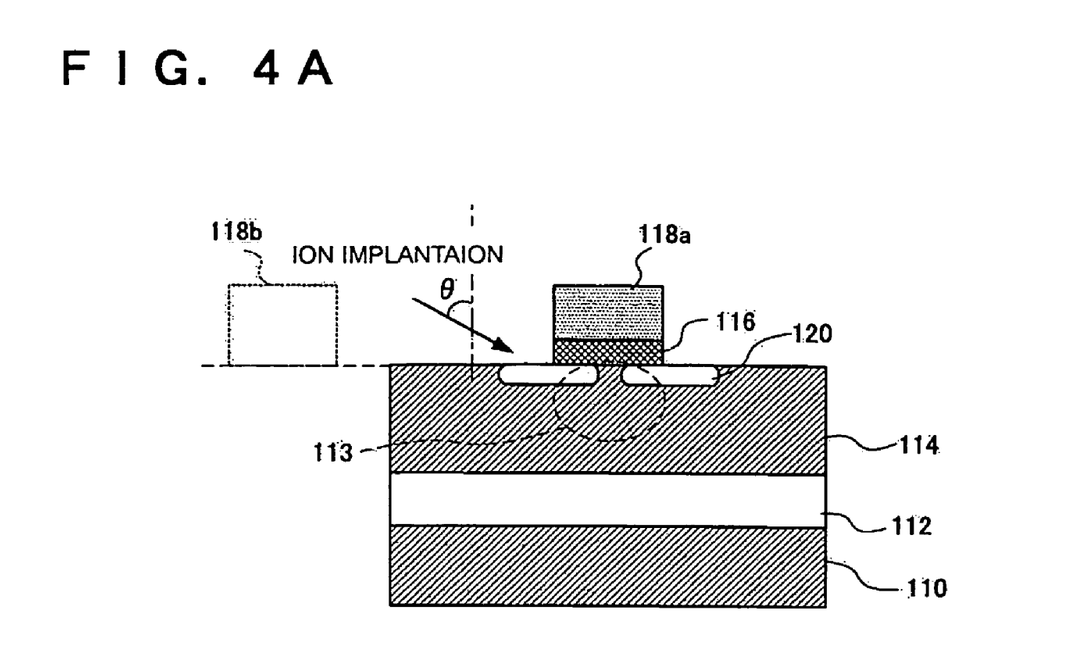
FIG. 4A and FIG. 4B are cross-sectional views depicting steps of the semiconductor device fabrication method according to the first embodiment after FIG. 3B.

Then as FIG. 4A shows, the pocket region 120 is formed by tilted ion implantation. Because the height (thickness) of the adjacent gate 118b is set as low as that of the gate electrode 118a, the ion implantation angle θ can be 60° or more with respect to the vertical line. In other words, the pocket region 120 can be formed without being affected by the presence of the gate electrode 118b of the adjacent transistor even if the desired ion implantation angle is about 60°, since the heights of the gate electrodes (118a and 118b) are low. In this way, according to the fabrication method of the present embodiment, the pocket region 120 can be formed with shallow depth (thin) deep under the gate electrode 118a. Being "deep" under the gate electrode 118a means close to the center of the lower surface of the gate electrode 118a. It should be noted that a very thin oxide film may be formed near the gate 118a by performing oxidation processing after gate patterning.

Figure 4B:
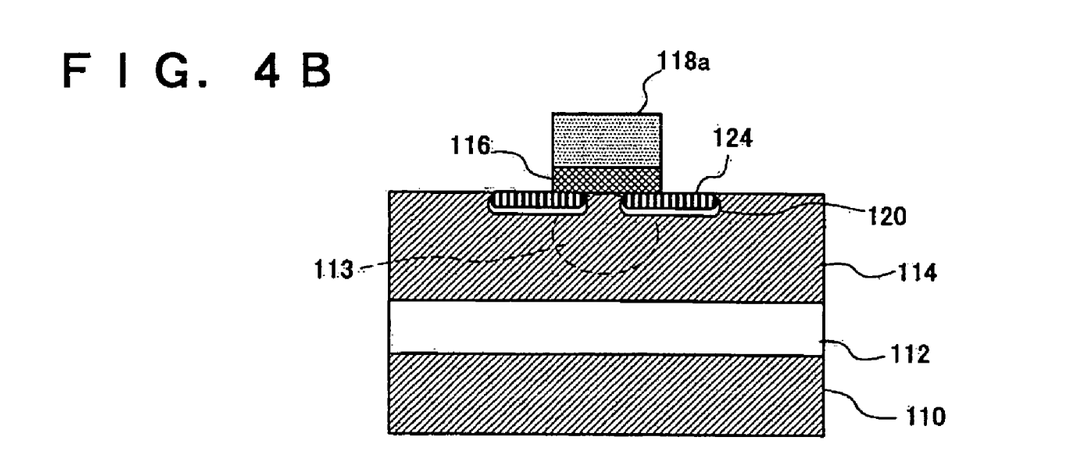
Figure 5A:
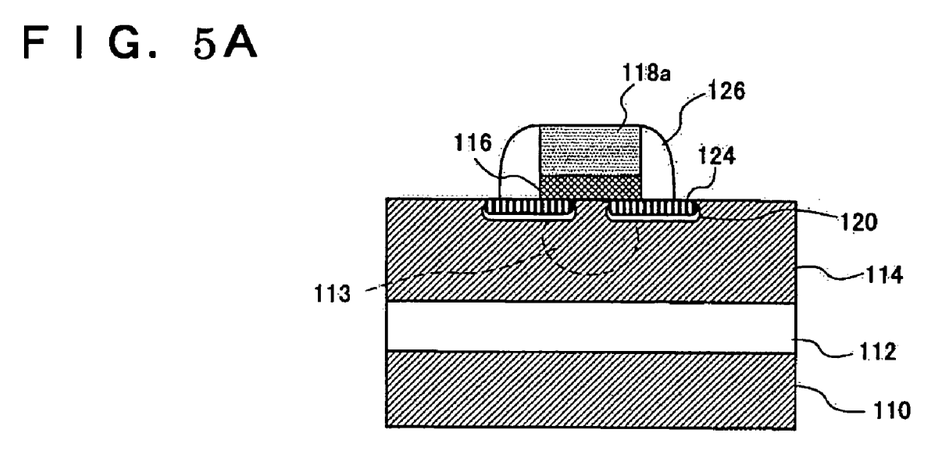
FIG. 5A and FIG. 5B are cross-sectional views depicting steps of the semiconductor device fabrication method according to the first embodiment after FIG. 4B.

Then as FIG. 4B shows, the LDD region 124 is formed. After that, as FIG. 5A shows, a side wall 126 is formed on a side face of the first gate electrode layer 118.

Figure 5B:
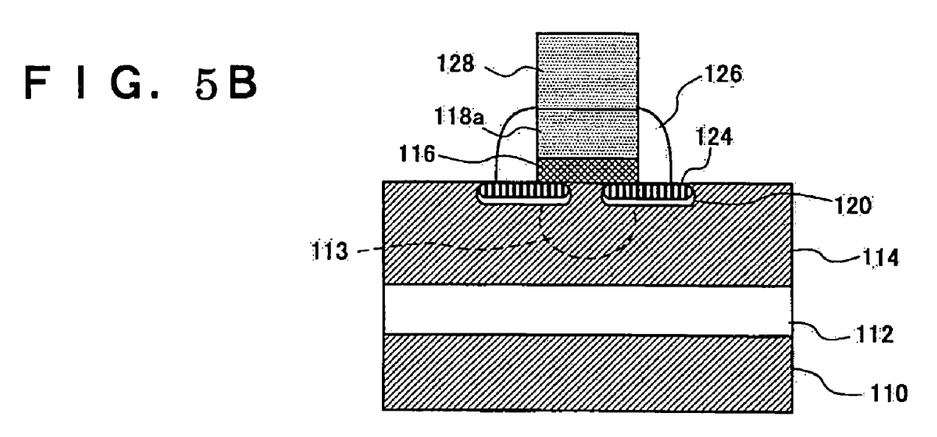

Then the second gate electrode layer (top or upper electrode layer) 128 is formed, as FIG. 5B shows, by depositing polysilicon on the first gate electrode layer 118, and performing gate patterning again. The second gate electrode layer 128 can be about 1000 Å (angstroms), for example. The margin of the pattern shift between the first gate electrode layer 118a and the second gate electrode layer 128 is absorbed because of the presence of the side wall 126. The side wall 126 may be formed regardless whether it is before or after forming the pocket region 120 or forming the LDD region 124. The side wall, which is formed before forming the LDD region 124, may be called a "spacer", and the same effect as the side wall 126 can be expected from the spacer.

In this embodiment, the second gate electrode layer 128 is formed on the first gate electrode layer 118a after the pocket region 120 is formed. Ultimately, therefore, the gate electrode can have a height sufficient to decrease the resistance of the gate electrode. Also a margin to align patterns, when the second gate electrode layer 128 is formed, can be secured since the side wall 126 is formed before forming the second gate electrode layer 128 on the first gate electrode layer 118a.

Figure 6A:
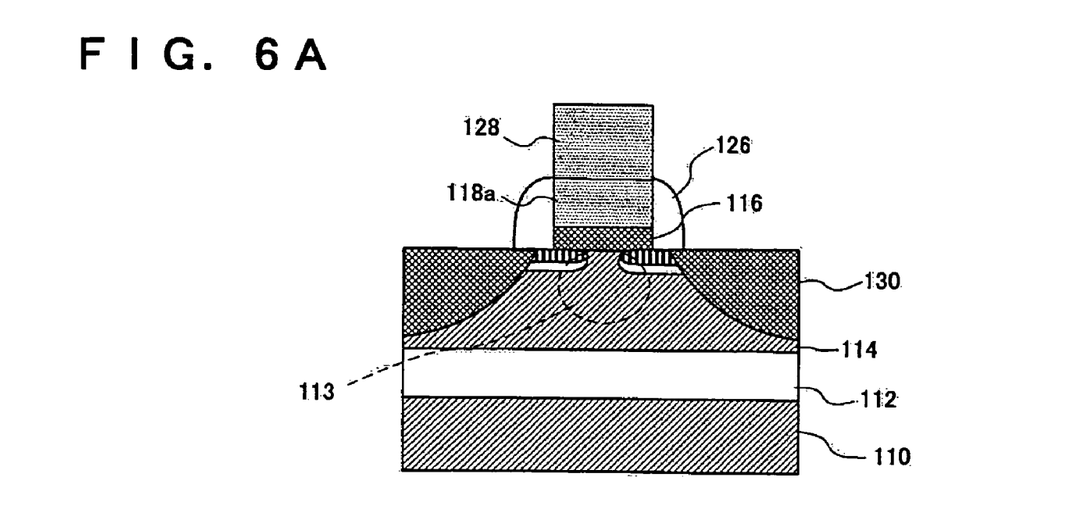
FIG. 6A and FIG. 6B are cross-sectional views depicting steps of the semiconductor device fabrication method according to the first embodiment after FIG. 5B.

Then as FIG. 6A shows, an impurity diffusion layer 130, to be a source-drain region, is formed in the SOI layer 114. The impurity diffusion layer 130 is self aligned and formed by the side wall 126, so that the film thickness and the form of the side wall 126 must be optimized considering the forming conditions of the diffusion layer 130. In this embodiment, because the impurity diffusion layer 130 is formed using the side wall 126 as a mask, a misalignment during patterning, when the second gate electrode layer 128 is formed, does not affect the position of the diffusion layer 130.

Figure 6B:
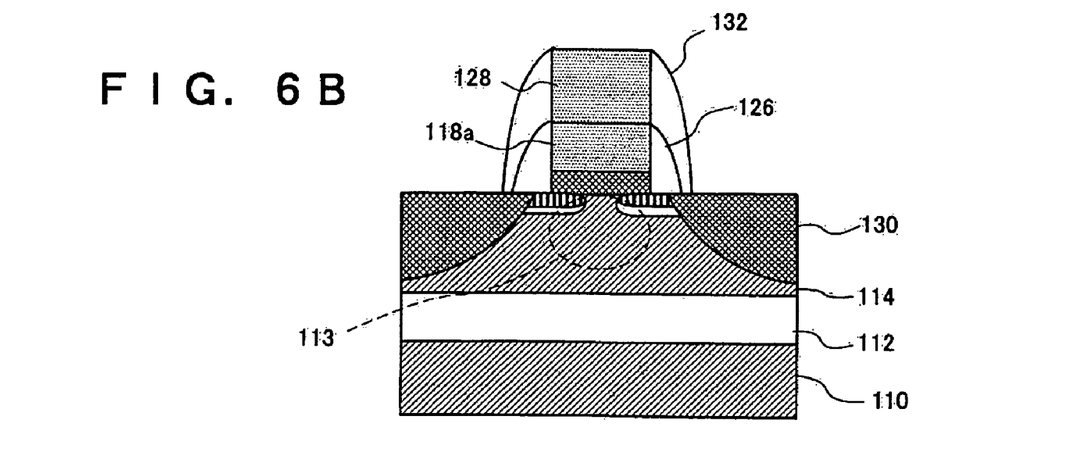

Then as FIG. 6B shows, a side wall 132 is formed again on the side face of the side wall 126 and second gate electrode layer 128. It should be noted that the side wall 132 need not always be formed.

Second Embodiment

Figure 7A:
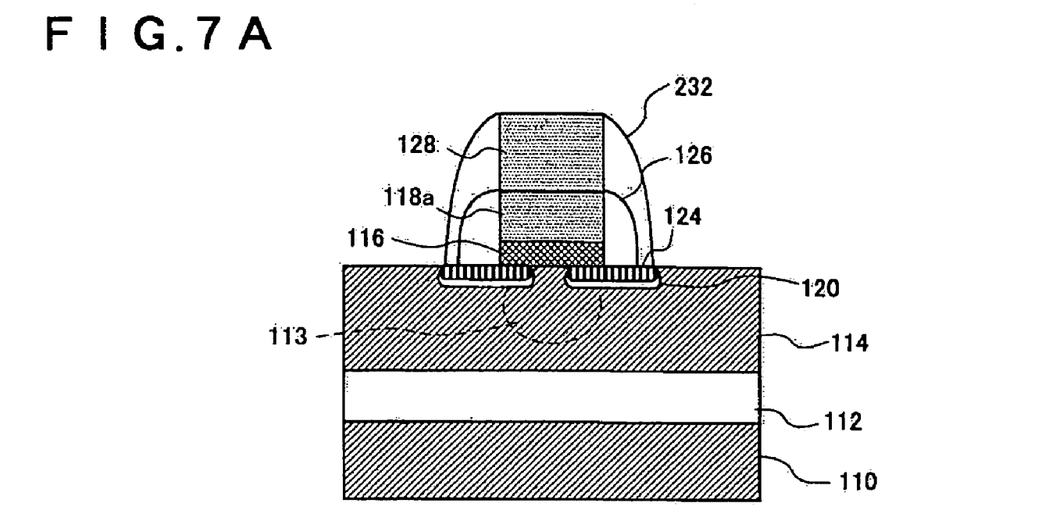
FIG. 7A and FIG. 7B are cross-sectional views depicting the characteristic steps of the semiconductor device fabrication method according to a second embodiment of the present invention.
Figure 7B:
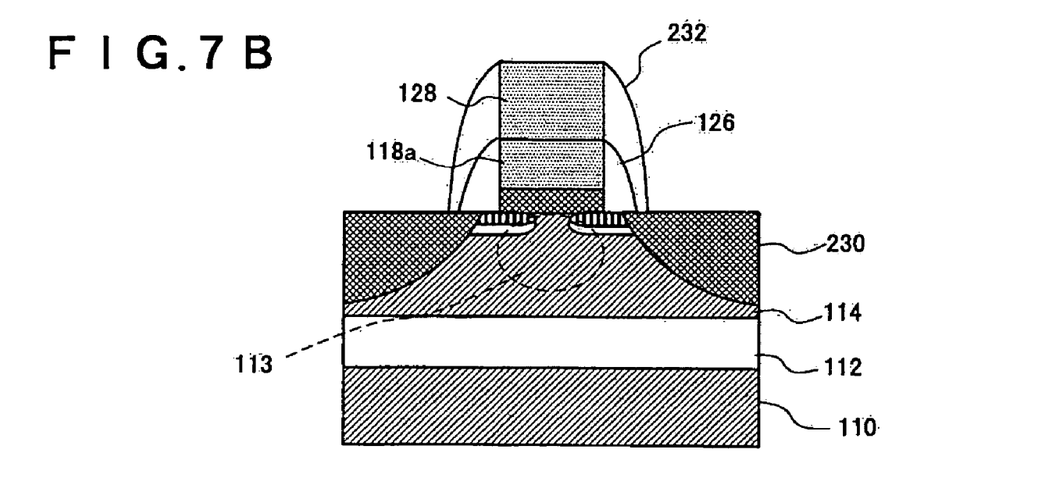

FIG. 7A and FIG. 7B are cross-sectional views depicting the characteristic steps of a fabrication method for a semiconductor device according to the second embodiment of the present invention. Steps of this fabrication method are the same as the first embodiment up to the step of FIG. 5B. Composing elements the same as or similar to the first embodiment are denoted with the same reference numerals and symbols, and redundant description will be omitted.

In the second embodiment, after the second gate electrode layer 128 is formed, the side wall 232 is formed on the side face of the second gate electrode layer 128 before forming the diffusion layer 230. In the first embodiment, the ion implantation performed to form the impurity diffusion region 130 is carried out using the side wall 126 on the side face of the first gate electrode layer 118a as a mask. Therefore if the ion implantation energy when the diffusion layer 130 is formed is high, ions may penetrate through the side wall 126. If the SOI film thickness of an ordinary complete depletion type SOI MOSFET is used, this penetration is of little concern as long as a material of which ion implantation blocking capability is high, such as nitride film, is used for the side wall 126, since implantation energy when the diffusion layer is formed is sufficiently low. However, if the height of the gate electrode layer 118a is extremely low, for example under 300 Å, it may become impossible to use the side wall 126 as a mask when the gate electrode layer 118a is formed.

In the second embodiment, as FIG. 7A shows, the side wall 232 is formed after the second gate electrode layer 128 is formed on the first gate electrode layer 118a. Therefore the side wall 232 has a sufficient height. By forming the diffusion layer 230 using the side wall 232 as a mask, there is little concern that ions will penetrate through the side wall 232 when the diffusion layer 230 is formed.

As described above, according to the fabrication method of the second embodiment, ions implanted when the diffusion layer is formed do not penetrate through the side wall even if the height of the first gate electrode layer 118a is extremely low.

It should be noted that the present invention is not limited to the first and second embodiments, but various changes and modifications can be made within the spirit and scope of the invention. For example, the present invention can be applied to a wafer having a structure other than an SOI, only if the structure has a thin conductive layer between insulating materials. The same effect as or similar effect to the above described embodiments can be expected with an SOS (Silicon On Sapphire) wafer. In the SOS wafer, an Si layer is formed on a sapphire substrate. The present invention can also be applied to a structure where buried oxide film of the SOI wafer is removed.

The present invention is particularly effective in an SOI-MOSFET. In a MOSFET which is fabricated using a bulk silicon substrate, a pocket region cannot be formed deep under the gate because of the presence of adjacent gates. The approach of increasing ion implantation energy requires forming a deep diffusion layer region in order to decrease the junction capacitance. Accordingly, this is in a trade off relationship with the short channel effect. Therefore the present invention is also effective for a bulk type MOSFET.

The number of stacked layers of the gate electrode layer is not limited to two, but may be three or more. Forming the low first gate electrode layer 118a, under about 1000 Å, is important and securing the final gate electrode height to have the desired resistance is also important. The desired resistance depends on the purpose of the circuit. If the desired resistance can be set to about 400 ohm/square, for example, then the final gate electrode height should be about 1500 Å.

This application is based on Japanese Patent Application No. 2005-359068 filed on Dec. 13, 2005, and the entire content of this Japanese application is incorporated herein by reference.

What is claimed is:

1. A fabrication method for a semiconductor device, comprising:
    forming a gate insulating film on a semiconductor layer;
    forming a first gate electrode layer on said gate insulating film;
    forming a pocket ion region under said first gate electrode layer;
    forming a second gate electrode layer overlaying said first gate electrode layer after forming the pocket ion region;
    forming a first side wall on a side face of said first gate electrode layer;
    forming a second side wall on a side face of said second gate electrode layer; and
    forming an impurity diffusion region on said semiconductor layer after forming said second side wall, wherein said first side wall is formed after said forming a first gate electrode layer and before said forming a second gate electrode layer.

2. The fabrication method according to claim 1, wherein said pocket ion region is formed by implanting ions in a tilted direction.

3. The fabrication method according to claim 2, wherein said tilt angle is about 60 degrees with respect to a vertical line.

4. The fabrication method according to claim 2, wherein said implanting the ions includes implanting arsenic or phosphorus with an impurity concentration of $2 \times 10^{15}$ cm$^{-2}$.

5. The fabrication method according to claim 2, wherein said implanting the ions includes implanting boron or $BF_2$ with an impurity concentration of $2 \times 10^{15}$ cm$^{-2}$.

6. The fabrication method according to claim 1, wherein said second gate electrode layer is an uppermost layer of a gate electrode of the semiconductor device.

7. The fabrication method according to claim 1, wherein said semiconductor device is an SOI-MOSFET.

8. The fabrication method according to claim 1, wherein said first gate electrode layer is about 500 angstroms in thickness and said second gate electrode layer is about 1,000 angstroms in thickness.

9. The fabrication method according to claim 1, wherein a thickness of said first gate electrode layer is about a half a thickness of said second gate electrode layer.

10. The fabrication method according to claim 1, wherein said second gate electrode layer is formed on said first gate electrode layer to have a width that is substantially the same as a width of said first gate electrode layer.

11. The fabrication method according to claim 10, wherein said pocket ion region is formed by implanting ions in a tilted direction.

12. The fabrication method according to claim 10, wherein said second gate electrode layer is an uppermost layer of a gate electrode of the semiconductor device.

13. The fabrication method according to claim 10, wherein said semiconductor device is an SOI-MOSFET.

14. The fabrication method according to claim 13, wherein said tilt angle is about 60 degrees with respect to a vertical line.

15. The fabrication method according to claim 10, wherein said first gate electrode layer is about 500 angstroms in thickness and said second gate electrode layer is about 1,000 angstroms in thickness.

16. The fabrication method according to claim 10, wherein a thickness of said first gate electrode layer is about a half a thickness of said second gate electrode layer.

17. The fabrication method according to claim 10, wherein said implanting the ions includes implanting arsenic or phosphorus with an impurity concentration of $2 \times 10^{15}$ cm$^{-2}$.

18. The fabrication method according to claim 10, wherein said implanting the ions includes implanting boron or BF$_2$ with an impurity concentration of for $2 \times 10^{15}$ cm$^{-2}$.

\* \* \* \* \*